United States Patent
Lusky et al.

(10) Patent No.: US 6,888,757 B2
(45) Date of Patent: May 3, 2005

(54) METHOD FOR ERASING A MEMORY CELL

(75) Inventors: Eli Lusky, Tel-Aviv (IL); Boaz Eitan, Ra'anana (IL)

(73) Assignee: Saifun Semiconductors Ltd., Netanya (IL)

(*) Notice: Subject to any disclaimer, the term of this patent is extended or adjusted under 35 U.S.C. 154(b) by 0 days.

(21) Appl. No.: 10/656,251

(22) Filed: Sep. 8, 2003

(65) Prior Publication Data
US 2004/0047198 A1 Mar. 11, 2004

Related U.S. Application Data

(63) Continuation-in-part of application No. 09/983,510, filed on Oct. 24, 2001, now Pat. No. 6,643,181.

(51) Int. Cl.$^7$ .................................................. G11C 16/06
(52) U.S. Cl. ........................ 365/185.22; 365/185.19; 365/185.2; 365/185.29; 365/194
(58) Field of Search ................... 365/185.22, 185.19, 365/185.2, 185.29, 194

(56) References Cited

U.S. PATENT DOCUMENTS

| | | |
|---|---|---|
| 3,895,380 A | 7/1975 | Cricchi et al. |
| 4,016,588 A | 4/1977 | Ohya et al. |
| 4,017,888 A | 4/1977 | Christie et al. |
| 4,151,021 A | 4/1979 | McElroy |
| 4,173,766 A | 11/1979 | Hayes |
| 4,173,791 A | 11/1979 | Bell |
| 4,281,397 A | 7/1981 | Neal et al. |
| 4,306,353 A | 12/1981 | Jacobs et al. |
| 4,342,149 A | 8/1982 | Jacobs et al. |
| 4,360,900 A | 11/1982 | Bate |
| 4,380,057 A | 4/1983 | Kotecha et al. |
| 4,388,705 A | 6/1983 | Sheppard |
| 4,389,705 A | 6/1983 | Sheppard |
| 4,435,786 A | 3/1984 | Tickle |
| 4,471,373 A | 9/1984 | Shimizu et al. |
| 4,521,796 A | 6/1985 | Rajkanan et al. |
| 4,527,257 A | 7/1985 | Cricchi |
| 4,586,163 A | 4/1986 | Koike |
| 4,630,085 A | 12/1986 | Koyama |
| 4,667,217 A | 5/1987 | Janning |
| 4,742,491 A | 5/1988 | Liang et al. |
| 4,780,424 A | 10/1988 | Holler et al. |
| 4,847,808 A | 7/1989 | Kobatake |
| 4,870,470 A | 9/1989 | Bass, Jr. et al. |
| 4,916,671 A | 4/1990 | Ichiguchi |
| 4,941,028 A | 7/1990 | Chen et al. |
| 5,021,999 A | 6/1991 | Kohda et al. |
| 5,075,245 A | 12/1991 | Woo et al. |

(Continued)

FOREIGN PATENT DOCUMENTS

| | | |
|---|---|---|
| EP | 0693781 | 1/1996 |
| EP | 0751560 | 1/1997 |
| EP | 1073120 | 1/2001 |

(Continued)

OTHER PUBLICATIONS

Chan et al., "*A True Single–Transistor Oxide–Nitride–Oxide EEPROM Device,*" IEEE Electron Device Letters, vol. EDL–B, No. 3, Mar. 1987.

(Continued)

*Primary Examiner*—Hoai Ho
(74) *Attorney, Agent, or Firm*—Eitan, Pearl, Latzer & Cohen Zedek, LLP

(57) ABSTRACT

A method for erasing a bit of a memory cell in a non-volatile memory cell array, the method comprising applying an erase pulse to at least one bit of at least one memory cell of the array, waiting a delay period wherein a threshold voltage of the at least one memory cell drifts to a different magnitude than at the start of the delay period, and after the delay period, erase verifying the at least one bit to determine if the at least one bit is less than a reference voltage level.

13 Claims, 2 Drawing Sheets

U.S. PATENT DOCUMENTS

| | | |
|---|---|---|
| 5,117,389 A | 5/1992 | Yiu |
| 5,159,570 A | 10/1992 | Mitchell et al. |
| 5,168,334 A | 12/1992 | Mitchell et al. |
| 5,172,338 A | 12/1992 | Mehrotra et al. |
| 5,175,120 A | 12/1992 | Lee |
| 5,214,303 A | 5/1993 | Aoki |
| 5,241,497 A | 8/1993 | Komarek |
| 5,260,593 A | 11/1993 | Lee |
| 5,268,861 A | 12/1993 | Hotta |
| 5,289,412 A | 2/1994 | Frary et al. |
| 5,293,563 A | 3/1994 | Ohta |
| 5,295,108 A | 3/1994 | Higa |
| 5,305,262 A | 4/1994 | Yoneda |
| 5,311,049 A | 5/1994 | Tsuruta |
| 5,315,541 A | 5/1994 | Harari et al. |
| 5,338,954 A | 8/1994 | Shimoji |
| 5,345,425 A | 9/1994 | Shikatani |
| 5,349,221 A | 9/1994 | Shimoji |
| 5,350,710 A | 9/1994 | Hong et al. |
| 5,359,554 A | 10/1994 | Odake et al. |
| 5,393,701 A | 2/1995 | Ko et al. |
| 5,394,355 A | 2/1995 | Uramoto et al. |
| 5,399,891 A | 3/1995 | Yiu et al. |
| 5,400,286 A | 3/1995 | Chu et al. |
| 5,412,601 A | 5/1995 | Sawada et al. |
| 5,414,693 A | 5/1995 | Ma et al. |
| 5,418,176 A | 5/1995 | Yang et al. |
| 5,418,743 A | 5/1995 | Tomioka et al. |
| 5,422,844 A | 6/1995 | Wolstenholme et al. |
| 5,424,978 A | 6/1995 | Wada et al. |
| 5,426,605 A | 6/1995 | Van Berkel et al. |
| 5,434,825 A | 7/1995 | Harari |
| 5,440,505 A | 8/1995 | Fazio et al. |
| 5,450,341 A | 9/1995 | Sawada et al. |
| 5,450,354 A | 9/1995 | Sawada et al. |
| 5,455,793 A | 10/1995 | Amin et al. |
| 5,467,308 A | 11/1995 | Chang et al. |
| 5,477,499 A | 12/1995 | Van Buskirk et al. |
| 5,495,440 A | 2/1996 | Asakura |
| 5,518,942 A | 5/1996 | Shrivastava |
| 5,521,870 A | 5/1996 | Ishikawa |
| 5,523,251 A | 6/1996 | Hong |
| 5,523,972 A | 6/1996 | Rashid et al. |
| 5,537,358 A | 7/1996 | Fong |
| 5,553,018 A | 9/1996 | Wang et al. |
| 5,563,823 A | 10/1996 | Yiu et al. |
| 5,583,808 A | 12/1996 | Brahmbhatt |
| 5,599,727 A | 2/1997 | Hakozaki et al. |
| 5,623,438 A | 4/1997 | Guritz et al. |
| 5,654,568 A | 8/1997 | Nakao |
| 5,656,513 A | 8/1997 | Wang et al. |
| 5,661,060 A | 8/1997 | Gill et al. |
| 5,683,925 A | 11/1997 | Irani et al. |
| 5,689,459 A | 11/1997 | Chang et al. |
| 5,712,814 A | 1/1998 | Fratin et al. |
| 5,715,193 A | 2/1998 | Norman |
| 5,726,946 A | 3/1998 | Yamagata et al. |
| 5,751,037 A | 5/1998 | Aozasa et al. |
| 5,754,475 A | 5/1998 | Bill et al. |
| 5,768,192 A | 6/1998 | Eitan |
| 5,768,193 A | 6/1998 | Lee et al. |
| 5,777,919 A | 7/1998 | Chi-Yung et al. |
| 5,781,476 A * | 7/1998 | Seki et al. ............. 365/185.22 |
| 5,784,314 A | 7/1998 | Sali et al. |
| 5,787,036 A | 7/1998 | Okazawa |
| 5,793,079 A | 8/1998 | Georgescu et al. |
| 5,812,449 A | 9/1998 | Song |
| 5,825,686 A | 10/1998 | Schmitt-Landsiedel et al. |
| 5,834,851 A | 11/1998 | Ikeda et al. |
| 5,836,772 A | 11/1998 | Chang et al. |
| 5,841,700 A | 11/1998 | Chang |
| 5,847,441 A | 12/1998 | Cutter et al. |
| 5,862,076 A | 1/1999 | Eitan |
| 5,864,164 A | 1/1999 | Wen |
| 5,870,335 A | 2/1999 | Khan et al. |
| 5,886,927 A | 3/1999 | Takeuchi |
| 5,920,507 A | 7/1999 | Takeuchi et al. |
| 5,946,258 A | 8/1999 | Evertt et al. |
| 5,946,558 A | 8/1999 | Hsu |
| 5,949,714 A | 9/1999 | Hemink et al. |
| 5,949,728 A | 9/1999 | Liu et al. |
| 5,963,412 A | 10/1999 | En |
| 5,963,465 A | 10/1999 | Eitan |
| 5,969,989 A | 10/1999 | Iwahashi |
| 5,969,993 A | 10/1999 | Takeshima |
| 5,973,373 A | 10/1999 | Krautschneider et al. |
| 5,990,526 A | 11/1999 | Bez et al. |
| 5,991,202 A | 11/1999 | Derhacobian et al. |
| 6,011,725 A | 1/2000 | Eitan |
| 6,018,186 A | 1/2000 | Hsu |
| 6,020,241 A | 2/2000 | You et al. |
| 6,028,324 A | 2/2000 | Su et al. |
| 6,030,871 A | 2/2000 | Eitan |
| 6,034,403 A | 3/2000 | Wu |
| 6,034,896 A | 3/2000 | Ranaweera et al. |
| 6,063,666 A | 5/2000 | Chang et al. |
| 6,064,591 A | 5/2000 | Takeuchi et al. |
| 6,075,724 A | 6/2000 | Li et al. |
| 6,097,639 A | 8/2000 | Choi et al. |
| 6,128,226 A | 10/2000 | Eitan et al. |
| 6,134,156 A | 10/2000 | Eitan |
| 6,137,718 A | 10/2000 | Reisinger |
| 6,157,570 A | 12/2000 | Nachumovsky |
| 6,163,048 A | 12/2000 | Hirose et al. |
| 6,181,605 B1 | 1/2001 | Hollmer et al. |
| 6,201,282 B1 | 3/2001 | Eitan |
| 6,215,148 B1 | 4/2001 | Eitan |
| 6,215,702 B1 | 4/2001 | Derhacobian et al. |
| 6,256,231 B1 | 7/2001 | Lavi et al. |
| 6,266,281 B1 | 7/2001 | Derhacobian et al. |
| 6,285,574 B1 | 9/2001 | Eitan |
| 6,292,394 B1 | 9/2001 | Cohen et al. |
| 6,304,485 B1 | 10/2001 | Harari et al. |
| 6,307,807 B1 | 10/2001 | Sakui et al. |
| 6,348,711 B1 | 2/2002 | Eitan |
| 6,396,741 B1 | 5/2002 | Bloom et al. |
| 6,490,204 B2 | 12/2002 | Bloom et al. |
| 6,552,387 B1 | 4/2003 | Eitan |
| 6,643,181 B2 * | 11/2003 | Sofer et al. ............. 365/185.22 |
| 2002/0132436 A1 | 9/2002 | Eliyahu et al. |
| 2002/0191465 A1 | 12/2002 | Maayan et al. |
| 2003/0076710 A1 | 4/2003 | Sofer et al. |

FOREIGN PATENT DOCUMENTS

| | | |
|---|---|---|
| GB | 2157489 | 10/1985 |
| JP | 04226071 | 8/1992 |
| JP | 04291962 | 10/1992 |
| JP | 05021758 | 1/1993 |
| JP | 07193151 | 7/1995 |
| JP | 09162314 | 6/1997 |
| WO | WO 96/15553 | 5/1996 |
| WO | WO 99/31670 | 6/1999 |

OTHER PUBLICATIONS

Eitan et al., "Hot–Electron Injection into the Oxide in n–Channel MOS Devices," IEEE Transactions on Electron Devices, vol. ED–38, No. 3, pp. 328–340, Mar. 1981.

Roy, Anirban "*Characterization and Modeling of Charge Trapping and Retention in Novel Multi–Dielectic Nonvolatile Semiconductor Memory Device,*" Doctoral Dissertation, Sherman Fairchild Center, Department of Computer Science and Electrical Engineering, pp. 1–35, 1989.

"*2 Bit/Cell EEPROM Cell Using Band–To–Band Tunneling For Data Read–Out,*" IBM Technical Disclosure Bulletin, US IBM Corp. NY vol. 35, No 4B, ISSN: 0018–88689, Sep., 1992.

Hsing–Huang Tsent et al. "*Thin CVD Gate Dielectric for USLI Technology*", IEEE, 0–7803–1450–6, 1993.

Pickar, K.A., "*Ion Implementation in Silicon,*" Applied Solid State Science, vol. 5, R. Wolfe Edition, Academic Press, New York, 1975.

Bruno Ricco, "*Nonvolatile Multilevel Memories for Digital Application*", IEEE, vol. 86, No. 12, issued Dec. 1998, pp. 2399–2421.

Chang, J., "*Non–Vollatile Semiconductor Memory Devices,*" Proceeding of the IEEE, vol. 64 No. 7, Issued Jul. 1976.

Ma et al., "*A dual–bit Split–Gate EEPROM (DSG) Cell in Contactless Array for Single–Vcc High Density Flash Memories*", IEEE, pp. 3.5.1–3.5.4, 1994.

Oshima et al., "*Process and Device Technologies for 16Mbit Eproms with Large—Tilt —Angle Implemented P–Pocket Cell,*" IEEE, CH2865–4/90/0000–0095, pp. 5.2.1–5.2.4, 1990.

Lee, H., "*A New Approach For the Floating–Gate MOS NonVolatile Memory*", Applied Physics Letters, vol. 31, No. 7, pp. 475–478, Oct. 1977.

Bhattacharyya et al., "*FET Gate Structure for Nonvolatile N–Channel Read–Mostly Memory Devices,*" IBM Technical Disclosure Bulletin, US IBM Corp. vol. 18, No. 6, p. 1768, 1976.

Bude et al., "*EEPROM/Flash Sub 3.0V Drain—Source Bias Hot Carrier Writing*", IEDM 95, pp. 989–992.

Bude et al., "*Secondary Electron Flash—a High Performance, Low Power Flash Technology for 0.35 μm and Below*", IEDM 97, pp. 279–282.

Bude et al., "*Modeling Nonequilibrium Hot Carrier Device Effects*", Conferences of Insulator Specialists of Europe, Sweden, Jun., 1997.

Eitan, U.S. Appl. No. 08/905,286, filed Aug. 1, 1997.

Eitan, U.S. Appl. No. 09/536,125, filed Mar. 28, 2000.

Avni et al., U.S. Appl. No. 09/730,586, filed Dec. 7, 2000.

Eitan, U.S. Appl. No. 08/902,690, filed Jul. 30, 1997.

International Search Report of International Application PCT/IL02/00855 dated Apr. 21, 2003.

* cited by examiner

METHOD FOR ERASING A MEMORY CELL

CROSS REFERENCE TO OTHER APPLICATIONS

The present application is a continuation-in-part of U.S. Pat. No. 6,643,181, entitled "Method For Erasing A Memory Cell", assigned to the assignee of the present application, and claims priority therefrom.

FIELD OF THE INVENTION

The present invention relates generally to erasing memory cells of non-volatile memory arrays, and particularly to methods for erasing a bit of a memory cell so as to reduce retention loss thereafter and increase reliability.

BACKGROUND OF THE INVENTION

A well known type of non-volatile cell is a nitride, read only memory (NROM) cell, described in such patents as Applicant's U.S. Pat. No. 6,490,204, entitled "Programming And Erasing Methods For An NROM Array", and Applicant's U.S. Pat. No. 6,396,741, entitled "Programming Of Nonvolatile Memory Cells", the disclosures of which are incorporated herein by reference.

Unlike a floating gate cell, the NROM cell has two separated and separately chargeable areas. Each chargeable area defines one bit. The separately chargeable areas are found within a nitride layer formed in an oxide-nitride-oxide (ONO) sandwich underneath a gate. When programming a bit, channel hot electrons are injected into the nitride layer. Programming an NROM cell may typically involve applying positive voltages to gate and drain terminals of the transistor, while the source may be floated.

Erasing an NROM cell requires decreasing the threshold voltage of the cell. Erasing an NROM cell, which is done in the same source/drain direction as programming, typically involves applying a negative voltage to the gate and a positive voltage to the drain, while the source may be floated. The negative gate voltage creates holes in the junction near the drain, typically through band-to-band tunneling. The holes may be accelerated by the lateral field near the drain and the ONO layer. As the holes accelerate towards the drain, they eventually achieve sufficient energy to be injected into the nitride layer, this being known as tunnel-assisted hot hole injection.

A concern with NROM cells, as well as for other kinds of non-volatile memory (NVM) cells, is drift or unintended changes in the threshold voltages of memory cells. For example, over time at room temperature, bits that are supposed to be in an erased state may experience an increase in threshold voltage.

There are several problems associated with the drift problem. The changes alter the state of the memory cell and the data value stored therein, thereby creating a data error. Such data errors are intolerable in many memory applications. The drift causes a loss in the margin of voltage level between the erased state voltage level and the read reference level. Accordingly, in the prior art, the erase verify level may be set at a certain low voltage level, taking into account a factor of safety so as to distance the erased state voltage level from the read reference level. This is referred to as maintaining a "window" between the erased state voltage level and the read reference level. There may be likewise a "window" between the programmed state voltage level and the read reference level. One way of combating the margin loss would be to maintain a large window that would separate the erased state voltage level from the read reference level even after drift in the erased state voltage level over time. However, this in turn causes other problems. A larger window may lower reliability by detrimentally affecting cycling and retention. In addition, the larger window necessitates longer write times, thereby causing a loss in performance.

Applicant's U.S. patent application Ser. No. 09/983,510, entitled "Method For Erasing A Memory Cell", corresponding to published PCT patent application WO 03/036650 (PCT/IL02/00855), provides further methods for erasing a bit of a memory cell so as to reduce the drift of the threshold voltage thereafter. After applying an erase pulse to a bit, the bit is read to check if the bit has passed an erase verify level. If the bit has passed the erase verify level, then at least one more erase pulse is applied to that bit. The extra erase pulse may be applied with the same or different voltage levels of gate and drain and for the same or different time duration as the previous erase pulse.

The application of one or more extra erase pulses lowers the initial threshold voltage of the erased bit. This provides several advantages. First, it will take longer for the threshold voltage to drift upwards than the prior art. Second, the erase verify level may be set at a higher voltage level than the prior art. Third, the application of the extra erase pulse or pulses may actually decrease the slope of the increase in threshold voltage level of the erased bit.

However, the extra erase pulse may have the disadvantage of increasing the number of holes in the ONO stack dielectric, which may increase the retention loss.

SUMMARY OF THE INVENTION

The present invention seeks to provide improved methods for erasing a bit of a memory cell so as to reduce the retention loss thereafter. In accordance with an embodiment of the present invention, a time delay may be implemented before erase verifying, that is, before checking if the bit has passed an erase verify level. Waiting before performing erase verify (EV) may allow the erased state threshold voltage to drift upwards before EV. If EV is passed after the end of the wait period, then no extra erase pulse is needed. Avoiding application of an unnecessary extra erase pulse may prevent or reduce enhanced retention loss.

There is thus provided in accordance with an embodiment of the invention a method for erasing at least a single bit of a memory cell in a non-volatile memory cell array, the method including applying an erase pulse to at least one bit of at least one memory cell of the array, waiting a delay period wherein a threshold voltage of the at least one memory cell drifts to a different magnitude than at the start of the delay period, and after the delay period, erase verifying the at least one bit to determine if the at least one bit is less than a reference voltage level.

In accordance with an embodiment of the invention the delay period is determined as a function of prior threshold voltage drift behavior of at least one similar memory cell.

Further in accordance with an embodiment of the invention, during the delay period, an environmental and/or erase condition of the at least one memory cell may or may not remain generally unchanged. The environmental condition may comprise at least one of temperature, pressure, and humidity. The erase condition may comprise at least one of a gate voltage, a drain voltage, a source voltage, and a time duration of an erase pulse.

Still further in accordance with an embodiment of the invention the at least one memory cell comprises a channel formed in a substrate, two diffusion areas formed one on either side of the channel in the substrate, and an oxide-nitride-oxide (ONO) layer formed at least over the channel, the ONO layer comprising a bottom oxide layer, a top oxide layer and a nitride layer intermediate the bottom and top oxide layers, and wherein the delay period is determined as a function of the thickness of the bottom layer.

In accordance with an embodiment of the invention, if the at least one bit does not pass the erase verify level (i.e., the threshold voltage is not less than the reference voltage level), then at least one more erase pulse is applied to the at least one bit. Optionally, in accordance with another embodiment of the invention, even if the at least one bit passes the erase verify level, then at least one more erase pulse may be applied to the at least one bit.

There is also provided in accordance with an embodiment of the invention a nonvolatile memory cell array comprising a plurality of memory cells, a power supply adapted to generate erase pulses to bits of the cells, and a controller in communication with the power supply, the controller adapted to perform the steps of:

applying an erase pulse to at least one bit of at least one memory cell of the array, waiting a delay period wherein a threshold voltage of the at least one memory cell drifts to a different magnitude than at the start of the delay period, and after the delay period, erase verifying the at least one bit to determine if the at least one bit is less than a reference voltage level.

In accordance with an embodiment of the invention the memory cells comprise nitride read only memory (NROM) cells.

BRIEF DESCRIPTION OF THE DRAWINGS

The present invention will be understood and appreciated more fully from the following detailed description taken in conjunction with the appended drawings in which.

DETAILED DESCRIPTION OF THE PRESENT INVENTION

Figure 1:
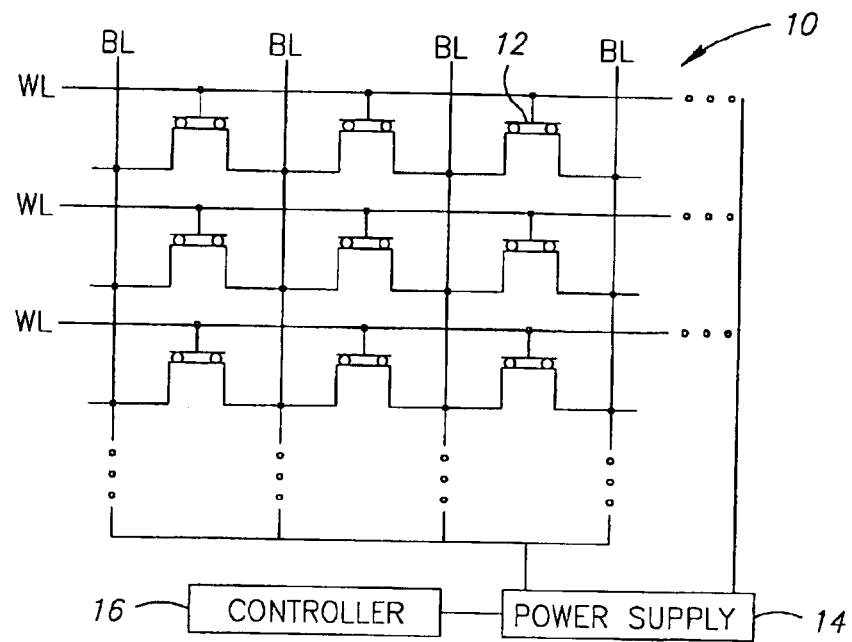
FIG. 1 is a simplified schematic illustration of non-volatile memory cell array, constructed and operative in accordance with a preferred embodiment of the present invention.

Reference is now made to FIG. 1, which illustrates a non-volatile memory cell array 10 constructed and operative in accordance with a preferred embodiment of the present invention. Array 10 may be an EEPROM array, for example. Array 10 comprises a multiplicity of memory cells 12 each connected to an associated word line, generally designated WL, and two bit lines, generally designated BL. A single memory cell 12 may store a single bit or multiple bits.

A power supply 14 is adapted to generate erase pulses to erase bits of memory cells 12. A controller 16 is preferably in communication with power supply 14 to control erasure of the bits, as is described in detail hereinbelow.

In accordance with one embodiment of the present invention, memory cells 12 are nitride read only memory (NROM) cells. The description follows for NROM cells, however, the present invention is not limited to NROM cells.

Figure 2:
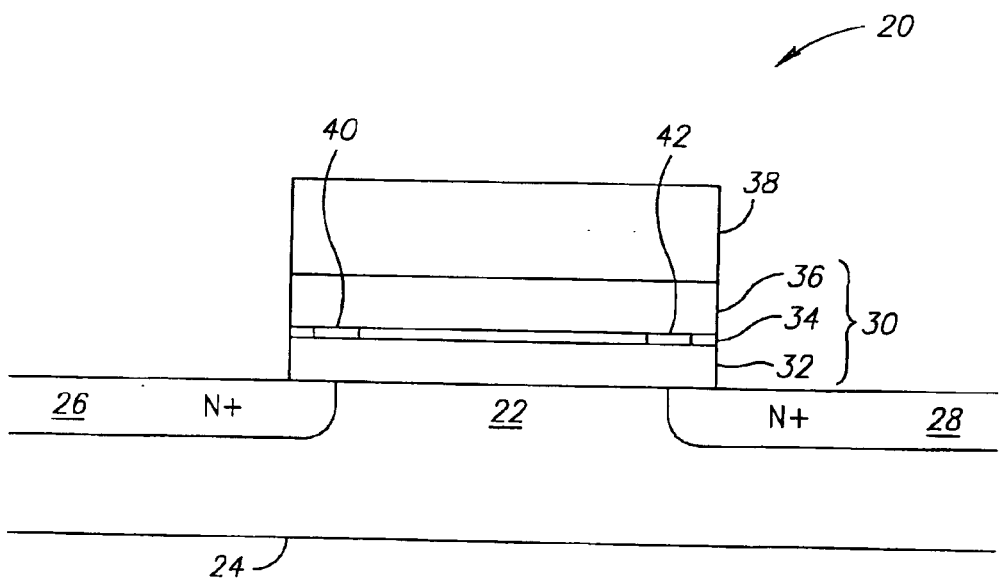
FIG. 2 is a simplified illustration of an example of a memory cell used in the array of FIG. 1, the example being an NROM cell, constructed and operative in accordance with an embodiment of the invention.

Reference is now made to FIG. 2, which illustrates one example of memory cell 12, the example being an NROM cell 20, constructed and operative in accordance with an embodiment of the invention.

NROM cell 20 preferably includes a channel 22 formed in a substrate 24. Two diffusion areas 26 and 28 are preferably formed on either side of channel 22 in substrate 24, each diffusion area having a junction with channel 22. An oxide-nitride-oxide (ONO) layer 30 (i.e., a sandwich of a bottom oxide layer 32, a nitride layer 34 and a top oxide layer 36) is preferably formed at least over channel 22, and a poly-silicon gate 38 is preferably formed at least over ONO layer 30. NROM cell 20 may comprise two separated and separately chargeable areas 40 and 42 in the nitride layer 34, each chargeable area defining and storing one bit.

Figure 3:
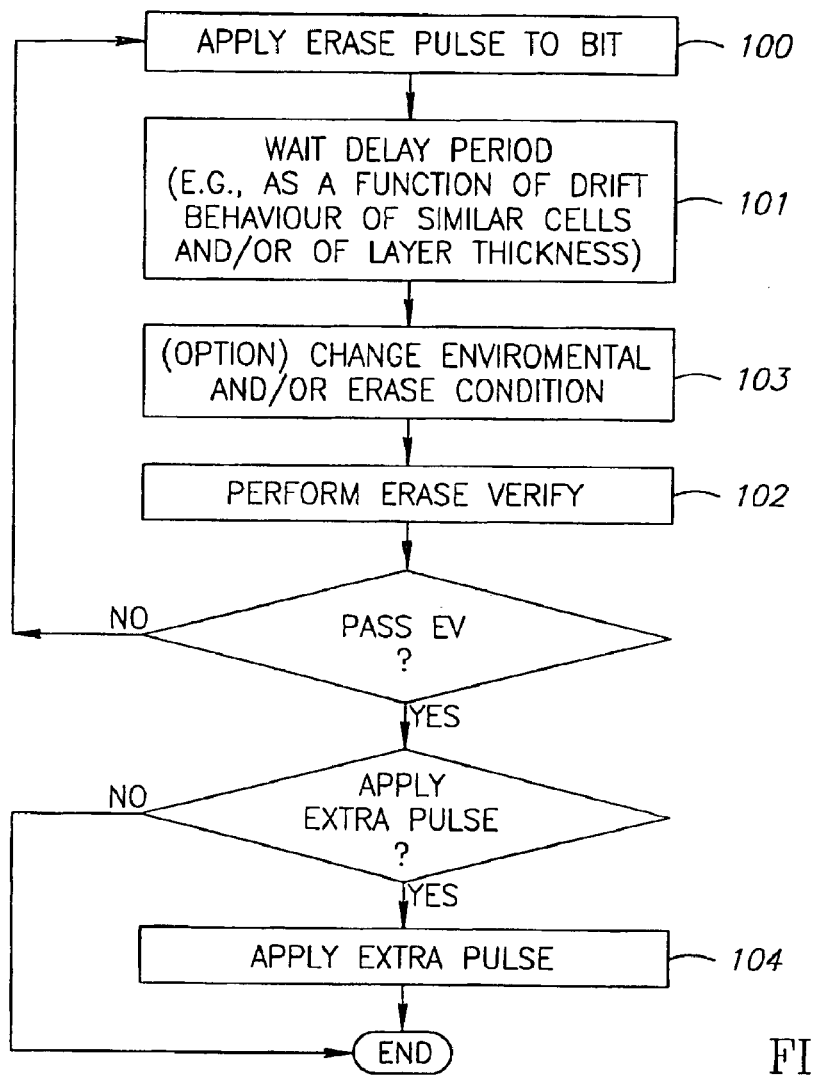
FIG. 3 is a simplified flow chart of a method for erasing a bit or bits in the array of FIG. 1, in accordance with an embodiment of the present invention.

Reference is now made to FIG. 3, which illustrates a method for erasing a bit of the memory cell 12 in array 10, in accordance with an embodiment of the present invention.

An erase pulse is applied (by means of power supply 14 and controller 16, FIG. 1) to one or more bits of one or more memory cells 12 of array 10 (step 100). Application of erase pulses to a selected bit in a preferred embodiment generally comprises application of a negative gate voltage to the word line of the bit, a positive drain voltage to the bit line serving as drain, and a floating voltage to the bit line serving as source. The magnitude and time duration of the negative gate voltage and positive drain voltage, inter alia, affect the amount of erasure of the bit. Procedures for applying erase pulses are described in Applicant's U.S. Pat. No. 6,490,204, for example.

The erase pulse lowers the threshold voltage of the bit. The threshold voltage of any bit is generally checked by reading the bit, such as with a sense amplifier (not shown), as is known in the art. If the threshold voltage of the bit is less than a reference voltage level, then that bit is considered to be in an erased state. Conversely, if the threshold voltage of the bit is not less than the reference voltage level, then that bit is not considered to be in an erased state. This is referred to as "erase verify" (EV).

Figure 4:
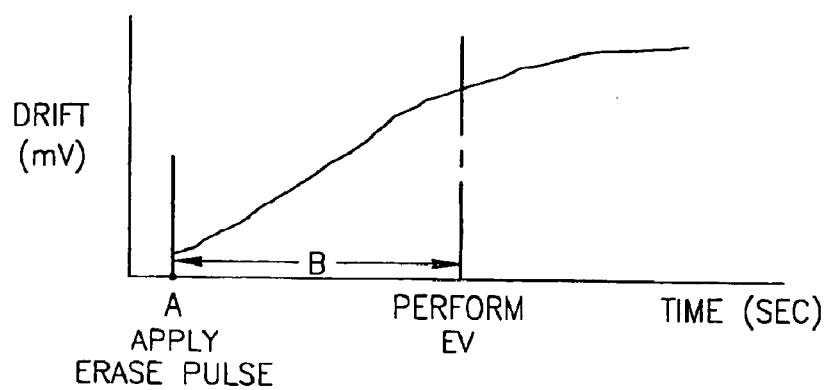
FIG. 4 is a simplified graphical illustration of an upward drift of the threshold voltage of the memory cells during a wait period before implementing erase verify.

In accordance with an embodiment of the present invention, the method waits a delay period before performing EV (step 101). During the delay period, the threshold voltage of the one or more memory cells 12 may drift to a different magnitude (typically, a greater magnitude) than at the start of the delay period. This may be seen graphically in FIG. 4, to which reference is now additionally made. At point A (e.g., at time zero), the erase pulse is applied to the one or more bits of one or more memory cells 12 of array 10. A delay period B is then implemented, during which the threshold voltage may drift upwards, i.e., increase with time.

In one embodiment of the present invention, the time duration of delay period B may be determined as a function of prior threshold voltage (Vt) drift behavior of one or more similar memory cells. For example, the threshold voltage may increase, without limitation, at a rate of about 50 mV per decade of time in a log scale, and may eventually approach an upper limit asymptotically. The delay period B may be chosen such that most of the threshold voltage rise has occurred by the end of the delay period B. In accordance with another embodiment of the invention, the delay period B may be determined as a function of the thickness of one of the layers of the ONO layer 30, such as but not limited to, the bottom oxide layer 32. It has been found that decreasing the bottom oxide layer 32 may reduce the Vt saturation level and may also decrease the time duration of the delay period B, because the threshold voltage approaches the asymptotic limit more rapidly.

As a non-limiting example, if the thickness of bottom oxide layer 32 is about 50 angstroms, most of the threshold voltage increase (e.g., about 300 mV) may occur in approximately the first 60 seconds. In this example, erase verify may be delayed by a delay period of about 300 microseconds to 3 milliseconds in order to capture a significant part of the threshold voltage drift. The delay period may be implemented before applying one erase pulse, or may implemented consecutively before successive applications of erase pulses. Waiting the delay period before applying the erase pulse, whether singly or consecutively, may help avoid unnecessary application of an extra pulse after the last EV and may thus help reduce retention loss.

At the end of the delay period B, erase verify is preferably performed on the bit (step 102). If the threshold voltage of the bit is less than a reference voltage level, then that bit is considered to be in an erased state, and no further erase pulses may be applied.

If the threshold voltage of the bit is not less than a reference voltage level, then that bit is considered not to be in an erased state and the process may be repeated by applying the erase pulse (step 100) and waiting the delay period (step 101) before erase verifying again.

In summary, in one embodiment of the invention, one or more bits (e.g., a small or large portion of the array) may be erased with an erase pulse and erase verified after waiting the delay period. (This may be done bit by bit or performed for a portion of bits.) Those bits that pass EV (that is, their threshold voltages are less than the erase verify voltage level) may be marked (such as by a sticky bit in a buffer, for example) to indicate that no more erase pulses should be applied to them. Those bits that do not pass EV (that is, their threshold voltages are not less than the erase verify voltage level) may be further erased with erase pulses.

In another embodiment of the present invention, environmental and/or erase conditions may be changed during the delay period (step 103). The environmental condition may comprise, without limitation, temperature, pressure or humidity. The erase condition may comprise gate voltage, drain voltage, source voltage, and time duration of the erase pulse.

Alternatively, in accordance with another embodiment of the present invention, even if the particular bit has passed erase verify, then one or more erase pulses may be applied to that bit (step 104). The one or more additional erase pulses may be of an equal, less or greater magnitude than the erase pulse applied in step 100. "Greater magnitude" means more positive BL voltage or more negative WL voltage or both. Additionally or alternatively, the one or more additional erase pulses may be applied at an equal, less or greater time duration than the erase pulse applied in step 100. For example, if the previous erase pulse was Vg=−5 V and Vd=6 V for a duration of 250 $\mu$sec, then the additional erase pulse may be Vg=−5.2 V and Vd=6 V for a duration of 250 $\mu$sec. Another alternative may be Vg=−5 V and Vd=6.3 V for a duration of 250 $\mu$sec. Another alternative may be Vg=−5.5 V and Vd=6.3 V for a duration of 250 $\mu$sec. Yet another alternative may be Vg=−5 V and Vd=6 V for a duration of 500 $\mu$sec.

It will be appreciated by persons skilled in the art that the present invention is not limited by what has been particularly shown and described herein above. Rather the scope of the invention is defined by the claims that follow:

What is claimed is:

1. A method for erasing a bit of a memory cell in a non-volatile memory cell array, the method comprising:
  applying an erase pulse to at least one bit of at least one memory cell of said array;
  waiting a delay period wherein a threshold voltage of said at least one memory cell drifts to a different magnitude than at the start of the delay period; and
  after said delay period, erase verifying said at least one bit to determine if said at least one bit is less than a reference voltage level.

2. The method according to claim 1, wherein said delay period is determined as a function of prior threshold voltage drift behavior of at least one similar memory cell.

3. The method according to claim 1, wherein during said delay period, an environmental condition of said at least one memory cell remains generally unchanged.

4. The method according to claim 1, further comprising changing an environmental condition of said at least one memory cell during said delay period.

5. The method according to claim 4, wherein said environmental condition comprises at least one of temperature, pressure, and humidity.

6. The method according to claim 1, wherein an erase condition used to erase said at least one memory cell remains generally unchanged throughout said delay period.

7. The method according to claim 1, further comprising changing an erase condition used to erase said at least one memory cell after said delay period has started.

8. The method according to claim 7, wherein said erase condition comprises at least one of a gate voltage, a drain voltage, a source voltage, and a time duration of an erase pulse.

9. The method according to claim 1, wherein said at least one memory cell comprises a channel formed in a substrate, two diffusion areas formed one on either side of said channel in said substrate, and an oxide-nitride-oxide (ONO) layer formed at least over said channel, said ONO layer comprising a bottom oxide layer, a top oxide layer and a nitride layer intermediate said bottom and top oxide layers, and wherein said delay period is determined as a function of the thickness of said bottom layer.

10. The method according to claim 1, wherein if a threshold voltage of said at least one bit is not less than said reference voltage level, at least one more erase pulse is applied to said at least one bit.

11. The method according to claim 1, wherein if a threshold voltage of said at least one bit is less than said reference voltage level, at least one more erase pulse is applied to said at least one bit.

12. A non-volatile memory cell array comprising:
  a plurality of memory cells;
  a power supply adapted to generate erase pulses to bits of said cells; and
  a controller in communication with said power supply, said controller adapted to perform the steps of:
  applying an erase pulse to at least one bit of at least one memory cell of said array;
  waiting a delay period wherein a threshold voltage of said at least one memory cell drifts to a different magnitude than at the start of the delay period; and
  after said delay period, erase verifying said at least one bit to determine if said at least one bit is less than a reference voltage level.

13. The array according to claim 12, wherein said memory cells comprise nitride read only memory (NROM) cells.

* * * * *